United States Patent
Takeuchi et al.

(10) Patent No.: US 6,869,732 B2
(45) Date of Patent: Mar. 22, 2005

(54) GLASS SUBSTRATE FOR PHOTOMASKS AND PREPARATION METHOD

(75) Inventors: Masaki Takeuchi, Nakakubiki-gun (JP); Yukio Shibano, Nakakubiki-gun (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 227 days.

(21) Appl. No.: 10/125,518

(22) Filed: Apr. 19, 2002

(65) Prior Publication Data

US 2002/0155361 A1 Oct. 24, 2002

(30) Foreign Application Priority Data

Apr. 20, 2001 (JP) .................................. 2001-122397

(51) Int. Cl.⁷ .......................... G03F 9/00; B32B 17/06
(52) U.S. Cl. ........................................ 430/5; 428/426
(58) Field of Search ........................... 430/5, 22, 311; 428/426; 216/59, 67

(56) References Cited

U.S. PATENT DOCUMENTS

| | | | |
|---|---|---|---|
| 4,515,652 A | 5/1985 | Gimpelson et al. | |
| 5,225,035 A | 7/1993 | Rolfson | |
| 5,254,830 A | 10/1993 | Zarowin et al. | |
| 6,489,241 B1 * | 12/2002 | Thilderkvist et al. | 438/689 |
| 2002/0061452 A1 * | 5/2002 | Nozawa et al. | 430/5 |

FOREIGN PATENT DOCUMENTS

EP    0 514 046 A    11/1992

OTHER PUBLICATIONS

Patent Abstracts of Japan, vol. 1999, No. 01, Jan. 29, 1999, & JP 10 273788 A (Mori Yuzo; Nikon Corp), Oct. 13, 1998.
"Phase Shift Mask Fabrication Using Reactive Ion Etchng of Quartz Substrates," Research Disclosure, Kenneth Mason Publications, Hampshire, GB, No. 340, Aug. 1, 1992, p. 682 XP000324137.
M. Takeuchi et al., Properties Of Our Developing Next Generation Photomask Substrate, INSPEC, XP002194301.

* cited by examiner

*Primary Examiner*—S. Rosasco
(74) *Attorney, Agent, or Firm*—Millen White Zelano & Branigan, P.C.

(57) ABSTRACT

A glass substrate is to be used as a photomask having a patterned light-shielding film on a surface thereof and thus exposed to light. The substrate is leveled by local plasma etching such that an exposure surface may have a flatness of 0.04–2.2 nm/cm². Since the glass substrate is configured such that the exposure surface or hold surface of the resulting photomask is fully flat during the exposure step, it is suited for use as silica glass substrates for photomasks used in the photolithography of great interest in the fabrication of ICs, thus contributing to the achievement of finer patterns in the semiconductor field.

20 Claims, 1 Drawing Sheet

0.02μm RANGE CONTOUR LINE IMAGE
(CENTER LOWERD)

0.02μm RANGE CONTOUR LINE IMAGE
(CENTER LOWERD)

GLASS SUBSTRATE FOR PHOTOMASKS AND PREPARATION METHOD

This invention relates to glass substrates for use as photomasks in the most advanced application among semiconductor-related electronic materials, and a method for preparing the same.

BACKGROUND OF THE INVENTION

Quality parameters of photomask-forming silica glass substrates include the size and density of defects, flatness, surface roughness, the opto-chemical stability of material, and the chemical stability of surface. More strict requirements are imposed on these parameters as the design rule becomes ultra-fine. In connection with the flatness of photomask-forming silica glass substrates, it is required to provide a glass substrate having not only a flatness in the acceptable range, but also a sufficient shape or topography to ensure that an exposure surface of a photomask prepared therefrom is flat during exposure. If the exposure surface is not flat during exposure, the exposure light suffers off-focusing on a silicon wafer to exacerbate the pattern uniformity, failing to form a precise micropattern.

The exposure surface of the photomask (surface subject to light exposure during an exposure step) is required to have a flatness of up to 2.2 nm per square centimeter of the exposure surface area, or up to 0.5 $\mu$m for the 6025 size (152 mm by 152 mm by 6.35 mm) photomask. Typically, the photomask is prepared by forming a light-shielding film on a silica glass substrate and patterning the film. On use, the photomask is most often set horizontally during the exposure step by holding the peripheral surface of the photomask by means of a suction grip or the like. Then, the shape of the photomask during the exposure step is governed by not only the flatness of the substrate, but also the resultant force of the film stress, gravity warp and holding force. These factors differ depending on the quality and thickness of the light-shielding film, the patterning mode and the exposure apparatus. The flatness of the exposure surface is largely affected by the flatness of the hold surface of the photomask substrate during the exposure step although this is not always the case. It is then required that the portion of the silica glass substrate corresponding to the hold surface of the photomask have a higher degree of flatness. Specifically, the portion of the silica glass substrate corresponding to the hold surface of the photomask should preferably have a flatness of up to 1.3 nm/cm$^2$. Such local leveling is, in fact, impossible with current leveling methods based on the traditional polishing technology.

If the entire surface of a substrate is made flat, its portion corresponding to the hold surface is also flat. In the existing precision polishing methods such as rotary double-sided lapping on a batchwise basis and rotary single-side lapping on a single-wafer basis, soft abrasive cloths are used in the polishing of substrates so as to incur no or few defects. It is, in fact, impossible to level out non-uniformities over the entire substrate surface including its periphery.

When the factors associated with film stress and gravity warp must be taken into account, a technique capable of establishing a more complex arbitrary shape is needed, and the traditional precision polishing technology comes to the limit of its abilities.

SUMMARY OF THE INVENTION

An object of the invention is to provide a glass substrate for a photomask, which is configured such that an exposure surface of the photomask or the hold surface of the substrate becomes flat in an exposure step; and a method for preparing the same.

The invention is predicated on the following discovery. When a glass substrate having a patterned light-shielding film on a surface thereof is used as a photomask, the photomask is held in an exposure apparatus and exposed to light. The photomask includes a surface which is subject to exposure (exposure surface, hereinafter) and should be flat during the exposure step; or a portion of the glass substrate corresponding to the held portion of the photomask in the exposure apparatus should be flat. By computing a difference between the shape of the glass substrate having a patterned light-shielding film wherein the exposure surface is flat during the exposure step or the portion of the glass substrate corresponding to the held portion of the photomask in the exposure apparatus is flat and the shape of a starting glass substrate, and carrying out local plasma etching on the surface of the starting glass substrate in accordance with the computed difference, there is obtained a photomask-forming glass substrate having such a shape or topography that the exposure surface during the exposure step may have a flatness of 0.04 nm to 2.2 nm per cm$^2$ of the exposure surface area, or the portion of the glass substrate corresponding to the held portion of the photomask in the exposure apparatus (sometimes referred to as hold surface) may have a flatness of 0.04 nm to 4.5 nm per cm$^2$ of the hold surface area.

In one aspect, the invention provides a glass substrate which is to be used as a photomask having a patterned light-shielding film on a surface thereof, and thus exposed to light, the photomask including an exposure surface during the exposure step, wherein the substrate has been processed by local plasma etching such that the exposure surface has a flatness of 0.04 nm to 2.2 nm per square centimeter.

In another aspect, the invention provides a glass substrate having a patterned light-shielding film on a surface thereof, for use as a photomask which is held in an exposure apparatus during an exposure step, wherein the substrate has been processed by local plasma etching such that a portion of the glass substrate corresponding to the held portion of the photomask in the exposure apparatus has a flatness of 0.04 nm to 4.5 nm per square centimeter.

The glass substrate is most often a silica glass substrate.

In a further aspect, the invention provides a method for preparing a glass substrate having a patterned light-shielding film on a surface thereof, which is to be used as a photomask and thus exposed to light, the photomask including an exposure surface which is flat during the exposure step. The method involves the steps of computing a difference between the shape of the glass substrate having a patterned light-shielding film in which the exposure surface is flat during the exposure step and the shape of a starting glass substrate, and carrying out local plasma etching on the surface of the starting glass substrate in accordance with the computed difference.

In a still further aspect, the invention provides a method for preparing a glass substrate having a patterned light-shielding film on a surface thereof, for use as a photomask which is held in an exposure apparatus during an exposure step, wherein a portion of the glass substrate corresponding to the held portion of the photomask in the exposure apparatus is flat. The method involves the steps of computing a difference between the shape of the glass substrate wherein the portion of the glass substrate corresponding to the held portion of the photomask in the exposure apparatus is flat and the shape of a starting glass substrate, and carrying out local plasma etching on the surface of the starting glass substrate in accordance with the computed difference.

BRIEF DESCRIPTION OF THE DRAWING

The only figure.

DESCRIPTION OF THE PREFERRED EMBODIMENTS

Figure 1:
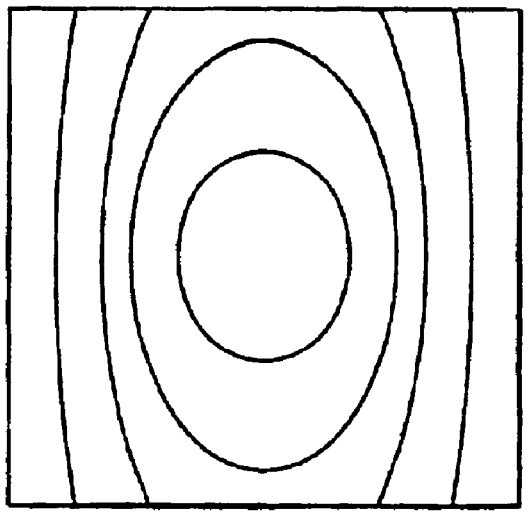
FIG. 1 is a contour line diagram showing the ideal shape of a glass substrate in Example 1.

The invention employs a plasma etching technique as the means for producing glass substrates for high-flatness photomasks. According to the invention, a difference between the shape of the final glass substrate wherein the exposure surface is flat during the exposure step and the shape of a starting glass substrate is computed. Local plasma etching is then carried out on the surface of the starting glass substrate in accordance with the computed difference, that is, at surface spots to be removed. Namely, plasma etching treatment is carried out while locally changing the amount of etching so as to increase or decrease the etching amount in accordance with the shape of a portion of a starting glass substrate as compared with the ideal shape of a corresponding portion of the final glass substrate wherein the exposure surface is flat during the exposure step. As for a portion of the photomask which is held in the exposure apparatus, a difference between the shape of the final glass substrate wherein a portion of the glass substrate corresponding to the held portion is flat and the shape of a starting glass substrate is computed, and local plasma etching is carried out in accordance with the difference.

As used herein, the phrase that the exposure surface or the hold surface is flat means that the surface is flat in the state where a patterned light-shielding film is present on a glass substrate. A photomask is generally prepared by forming a light-shielding film on a photomask-forming glass substrate, applying a resist film thereon, irradiating light to selected regions of the resist film, developing the resist film for patterning, etching the light-shielding film in accordance with the resist film pattern, and finally removing the resist film, leaving the patterned light-shielding film on the glass substrate. The photomask is loaded and held in an exposure apparatus where light exposure is carried out through the photomask for transferring its pattern to a wafer. When it is described that the exposure surface is flat during the exposure step or the portion of the photomask which is held in the exposure apparatus is flat, it refers to a flatness in the state where the patterned light-shielding film is present on the glass substrate at the end of manufacture of the photomask in the above-described manner. Then the ideal shape means that the exposure surface or the hold surface is completely flat in said state.

When plasma etching is carried out in accordance with the computed shape difference as described above, a plasma generating housing is positioned above a starting glass substrate at a surface spot to be removed, and an etchant gas is flowed through the housing. Neutral radical species generated in the plasma isotropically attack the glass substrate surface at that spot whereby the spot is etched away. In areas of the glass substrate surface outside the plasma generating housing, no plasma is generated and no etching takes place even though some etchant gas strikes against the surface. When the plasma generating housing is moved above the starting glass substrate, the rate of movement of the housing is controlled in accordance with the necessary amounts of removal from the starting glass substrate surface so that a glass substrate having the desired shape is eventually obtainable.

It is necessary that the surface shape or topography of the starting glass substrate be previously determined. Surface shape measurement may be done by any methods. It is desired that such measurement be of high precision, and thus, an optical interference method is a typical measurement. In accordance with the surface shape of the starting glass substrate, the rate of movement of the plasma generating housing is computed. Then the rate of movement is controlled to be slow in an area requiring a large amount of removal, so as to provide a more etching amount.

The photomask is prepared by first forming a light-shielding film of chromium or the like on a glass substrate, applying a resist film thereon, and writing a desired pattern on the resist film using an electron beam or the like. The resist film is then developed and the light-shielding film is etched therethrough. In this way, the photomask including light-transmitting and shielding areas is obtained. The photomask is set in an exposure apparatus where light exposure is carried out through the photomask to a silicon wafer having a resist film coated thereon, followed by a conventional device fabrication process.

In order that plasma etching be used to produce a photomask-forming glass substrate which is configured such that the exposure surface is flat during the exposure step, the ideal shape is computed from the conditions under which the photomask is set during the exposure step, a difference between the ideal shape and the shape of a starting substrate being a necessary amount of material to be removed by plasma etching. Also, the flatness of the portion of the glass substrate corresponding to the held portion of the photomask during the exposure step is important as previously described, and in this case, a difference between the shape of a portion of the starting substrate surface corresponding to the held portion and the ideal flat shape of the same portion gives a necessary amount of material to be removed.

The ideal shape can be determined from the type of exposure apparatus, the quality and thickness of the light-shielding film and the patterning mode, by stress computing simulation. Specifically, the surface area and flatness of a portion of a glass substrate corresponding to the held portion are determined from the shape of a photomask holder in the exposure apparatus. The light-shielding film is formed, for example, of chromium, chromium oxide or molybdenum silicide, and the film stress to the glass substrate can be computed from the material, structure and thickness of the light-shielding film. The light-shielding film may be a single layer or a plurality of layers. From the position, shape and area of a pattern on the film surface, the stress distribution of the patterned film that deforms the entire glass substrate can be computed. Finally, the ideal shape of the glass substrate which is configured such that the exposure surface is flat during the exposure step is determined by a counting-back procedure with any warp by its own weight of the photomask set in the exposure apparatus being additionally taken into account.

On the other hand, the shape or flatness of the starting glass substrate is measured by means of a flatness meter of the optical interference system as mentioned above. An amount of material corresponding to its difference from the ideal shape is removed by plasma etching.

The plasma generating housing may be of any structure. In one exemplary system, the glass substrate is sandwiched between a pair of electrodes, a plasma is created between the substrate and the electrode by application of a radio frequency power, and an etchant gas is flowed therethrough to generate radical species. In another system, an etchant gas is passed through a waveguide where a plasma is created by microwave oscillation, and the flow of radical species thus generated is impinged against the substrate surface.

The etchant gas is selected depending on the identity of glass substrate. For silica glass substrates for photomasks, a halide gas or a gas mixture containing a halide gas is preferred. The halide gas is exemplified by methane tetrafluoride, methane trifluoride, ethane hexafluoride, propane octafluoride, butane decafluoride, hydrogen fluoride, sulfur hexafluoride, nitrogen trifluoride, carbon tetrachloride, silicon tetrafluoride, methane trifluoride chloride and boron trichloride.

To control the rate of movement of the plasma generating housing in accordance with the amount of material to be removed from the surface of the starting glass substrate as mentioned above, a computer may be used. Since the movement of the plasma generating housing is relative to the substrate, the substrate itself may be moved instead.

The glass substrate is thus processed such that the exposure surface or the hold surface of the resultant photomask has a very high degree of flatness during the exposure step. The desired flatness of the exposure surface is 0.04 nm to 2.2 nm, especially 0.04 nm to 0.86 nm per square centimeter of the exposure surface. In the case of 6025 substrates (152 mm by 152 mm by 6.35 mm) which are most often used as the photomask-forming glass substrate, the exposure surface preferably has a flatness of 0.01 $\mu$m to 0.5 $\mu$m, especially 0.01 $\mu$m to 0.2 $\mu$m during the exposure step. The portion of the glass substrate corresponding to the portion of the photomask which is held in the exposure apparatus during the exposure step preferably has a flatness of 0.04 nm to 4.5 nm, especially 0.04 nm to 2.2 nm per square centimeter of the hold surface. The glass substrate is preferably dimensioned 152±0.2 mm by 152±0.2 mm by 6.35±0.1 mm.

Under certain plasma etching conditions, the surface of the glass substrate thus obtained can have surface roughness or a work-degraded layer. In such a case, if necessary, the plasma etching may be followed by a very short time of polishing which does bring substantially little change of flatness.

Preferred for the measurement of flatness from the standpoint of measurement precision is an optical interference method in which coherent light (matched phase relationship) as typified by laser light is directed to the substrate surface and reflected thereby, and a difference in height of substrate surface points is observed as a phase shift of reflected light.

The invention provides a glass substrate which is configured such that the exposure surface or the hold surface of the resulting photomask is fully flat during the exposure step. It is suited for use as silica glass substrates for photomasks used in the photolithography of great interest in the fabrication of ICs. The invention thus contributes to the achievement of finer patterns in the semiconductor field.

EXAMPLE

Examples of the invention are given below by way of illustration and not by way of limitation.

Example 1

The starting substrate used was a quartz substrate having a pair of square surfaces of 152 mm by 152 mm and a thickness of 6.4 mm. Plasma etching was carried out thereon. A photomask was obtained from the processed substrate. A suction grip was used to hold the photomask in an exposure apparatus, with the held portion having an area of 152 mm×3.5 mm (rectangular shape). The light-shielding film had a three-layer structure of chromium with a thickness of 400 nm and was patterned in a 1:1 line-and-space pattern with a line width of 0.80 $\mu$m. By stress computing simulation, the ideal shape of a photomask-forming quartz substrate was determined as shown in FIG. 1. The ideal flatness was 0.43 nm/cm$^2$. The surface shape of the starting substrate was measured by an optical interference flatness meter, finding a flatness of 3.4 nm/cm$^2$. A difference of this shape from the ideal shape was computed, a necessary amount of material to be removed was determined therefrom, and plasma etching was accordingly carried out. The plasma generating housing of radio frequency type (150 W) included cylindrical electrodes of 75 mm diameter. The etchant gas used was methane tetrafluoride. After plasma etching was carried out on the substrate, the substrate surface was measured again by the optical interference flatness meter, finding a shift of only 2% from the ideal shape. The substrate was then lightly polished by a single-side lapping machine and cleaned, whereupon the light-shielding film described above was coated and patterned. The light-shielding film-bearing substrate was customarily set in the same state as the photomask was held in the exposure apparatus. In this state, measurement by the optical interference flatness meter revealed that the exposure surface had a flatness of 0.1 nm/cm$^2$.

Example 2

The starting substrate used was a quartz substrate having a pair of square surfaces of 152 mm by 152 mm and a thickness of 6.4 mm. The shape of the quartz substrate was measured by an optical interference flatness meter, finding a flatness of 3.9 $\mu$m. Based on the irregularity data of regions of this substrate surface corresponding to the portions of the photomask to be held during the exposure step (two rectangular regions of 152 mm×3.5 mm at the substrate periphery sides), a necessary amount of material to be removed from these regions was determined. Plasma etching was carried out on the substrate surface in accordance with that amount.

The plasma generating housing of radio frequency type (150 W) included cylindrical electrodes of 75 mm diameter. The etchant gas used was methane tetrafluoride. After plasma etching was carried out on the substrate regions corresponding to the (photomask) held portions, the substrate surface was measured again by the optical interference flatness meter, finding that the rectangular regions of 152 mm×3.5 mm corresponding to the (photomask) held portions had a flatness of 2.1 nm/cm$^2$.

Japanese Patent Application No. 2001-122397 is incorporated herein by reference.

Reasonable modifications and variations are possible from the foregoing disclosure without departing from either the spirit or scope of the present invention as defined by the claims.

What is claimed is:

1. A glass substrate, which is to be used as a photomask having a patterned light-shielding film on a surface thereof and thus exposed to light, the photomask including an exposure surface during the exposure step, wherein the substrate has been processed by local plasma etching such that the exposure surface has a flatness of 0.04 nm to 2.2 nm per square centimeter.

2. The glass substrate of claim 1 which is a silica glass substrate.

3. A glass substrate for use as a photomask having a patterned light-shielding film on a surface thereof, which is held in an exposure apparatus during an exposure step, wherein the substrate has been processed by local plasma etching such that a portion of the glass substrate corresponding to the held portion of the photomask in the exposure apparatus has a flatness of 0.04 nm to 4.5 nm per square centimeter.

4. The glass substrate of claim 3 which is a silica glass substrate.

5. A method for preparing a glass, which is to be used as a photomask substrate having a patterned light-shielding film on a surface thereof and thus exposed to light, the photomask including an exposure surface which is flat during the exposure step, said method comprising the steps of:

stress computing simulating the shape of the glass substrate having a patterned light-shielding film in which the exposure surface is flat during the exposure step, and carrying out local plasma etching on the surface of the starting glass substrate based on the stress computing simulation.

6. A method for preparing a glass substrate for use as a photomask having a patterned light-shielding film on a surface thereof, which is held in an exposure apparatus during an exposure step, wherein a portion of the glass substrate corresponding to the held portion of the photomask in the exposure apparatus is flat, said method comprising the steps of:

stress computing simulating the shape of the glass substrate wherein the portion of the glass substrate corresponding to the held portion of the photomask in the exposure apparatus is flat, and carrying out local plasma etching on the surface of the starting glass substrate based on the stress computing simulation.

7. A glass substrate for a photomask which has a surface which is held in an exposure apparatus during an exposure step, comprising an exposure surface having a flatness of 0.04 nm–2.2 nm per square centimeter or a held surface having a flatness of 0.04 nm–4.5 nm per square centimeter.

8. A photomask comprising a glass substrate according to claim 1.

9. A photomask comprising a glass substrate according to claim 3.

10. A photomask comprising a glass substrate according to claim 7.

11. A method for preparing a glass for a photomask, comprising:

stress computing simulating a desired exposed surface having a flatness of 0.04 nm–2.2 nm per square centimeter or a held surface having a flatness of 0.04 nm–4.5 nm per square centimeter.

12. A method according to claim 11, further comprising etching a surface of the starting glass according to the stress computing simulation.

13. A method according to claim 11, wherein the shape of the starting glass is determined by a flatness meter of an optical interference system.

14. A glass substrate according to claim 1, wherein the exposure surface has a flatness of 0.04 nm–0.86 nm per square centimeter.

15. A glass substrate according to claim 3, wherein the held portion has a flatness of 0.04 nm–2.2 nm per square centimeter.

16. A 6025 glass substrate for a photomask comprising an exposure surface having a flatness of 0.01 nm–0.5 $\mu$m.

17. A 6025 glass substrate according to claim 16, having a flatness of 0.01 nm–0.2 $\mu$m.

18. A method according to claim 12, wherein the etching is accomplished by local plasma etching.

19. A method according to claim 12, wherein the etching is accomplished by passing an etchant gas through a waveguide creating a plasma for impinging against the surface of the starting material.

20. A method according to claim 12, wherein the etching is accomplished with an etchant gas of methane tetrafluoride, methane trifluorode, ethane hexafluoride, propane octafluoride, butane decafluoride, hydrogen fluoride, sulfur hexafluoride, nitrogen trifluoride, carbon tetrachloride, silicon tetrafluoride, methane trifluoride chloride or boron trichloride.

* * * * *